(12) United States Patent
Filler et al.

(10) Patent No.: US 9,429,623 B2
(45) Date of Patent: Aug. 30, 2016

(54) SOLUTION FOR FULL SPEED, PARALLEL DUT TESTING

(75) Inventors: W Scott Villareal Filler, Santa Clara, CA (US); Ahmed S. Tantawy, San Jose, CA (US); Erik H. Volkerink, Palo Alto, CA (US)

(73) Assignee: ADVANTEST CORPORATION, Tokyo (JP)

( * ) Notice: Subject to any disclaimer, the term of this patent is extended or adjusted under 35 U.S.C. 154(b) by 801 days.

(21) Appl. No.: 13/700,715

(22) PCT Filed: May 27, 2011

(86) PCT No.: PCT/US2011/038461
§ 371 (c)(1),
(2), (4) Date: Nov. 28, 2012

(87) PCT Pub. No.: WO2011/150409
PCT Pub. Date: Dec. 1, 2011

(65) Prior Publication Data
US 2013/0138383 A1 May 30, 2013

Related U.S. Application Data

(60) Provisional application No. 61/349,411, filed on May 28, 2010.

(51) Int. Cl.
| | |
|---|---|
| *G06F 11/263* | (2006.01) |
| *G06F 17/00* | (2006.01) |
| *G11C 29/56* | (2006.01) |
| *G01R 31/28* | (2006.01) |

(Continued)

(52) U.S. Cl.
CPC ..... *G01R 31/31908* (2013.01); *G01R 31/2834* (2013.01); *G06F 11/263* (2013.01); *G06F 11/2733* (2013.01); *G06F 17/00* (2013.01); *G11C 29/56* (2013.01)

(58) Field of Classification Search
CPC ............... G06F 11/27; G06F 11/2733; G06F 11/2736; G06F 11/277
See application file for complete search history.

(56) References Cited

U.S. PATENT DOCUMENTS

| | | | |
|---|---|---|---|
| 7,406,670 B1 * | 7/2008 | Ansari et al. | 716/136 |
| 7,873,885 B1 * | 1/2011 | Shin | G11C 29/08 365/185.33 |

(Continued)

FOREIGN PATENT DOCUMENTS

| | | |
|---|---|---|
| JP | 2001-124834 | 5/2001 |
| JP | 2001-311095 | 10/2002 |

(Continued)

OTHER PUBLICATIONS

Agrawal et l., "Design Tradeoffs for SSD Performance", Apr. 2008, USENIX Advanced Computing Systems Association, https://www.usenix.org/legacy/events/usenix08/tech/full_papers/agrawal/agrawal_html/index.html.*

(Continued)

*Primary Examiner* — Regis Betsch

(57) ABSTRACT

A system for use in automated test equipment. In one embodiment, the system includes a configurable integrated circuit (IC) programmed to provide test patterns and an interface to at least one device under test (DUT). The system also includes a connection to the at least one DUT, wherein the connection is coupled directly between the configurable IC and the at least one DUT.

19 Claims, 9 Drawing Sheets

(51) Int. Cl.
*G01R 31/319* (2006.01)
*G06F 11/273* (2006.01)

(56) References Cited

U.S. PATENT DOCUMENTS

| | | |
|---|---|---|
| 2003/0115517 A1 | 6/2003 | Rutten |
| 2007/0067687 A1* | 3/2007 | Ong ............................ 714/731 |
| 2007/0198881 A1* | 8/2007 | Volkerink ........ G01R 31/31903 714/724 |
| 2007/0266288 A1* | 11/2007 | Volkerink et al. ............ 714/738 |
| 2008/0089139 A1* | 4/2008 | Ong ........................ G11C 7/10 365/189.08 |
| 2008/0201622 A1 | 8/2008 | Hiew et al. |
| 2008/0204066 A1 | 8/2008 | Jang et al. |
| 2010/0091539 A1 | 4/2010 | Bang et al. |

FOREIGN PATENT DOCUMENTS

| | | | |
|---|---|---|---|
| JP | 2004-199536 | 7/2004 | |
| JP | 2006-003239 | 1/2006 | |
| JP | 2008-276608 | 11/2008 | |
| WO | WO2005010637 | 2/2005 | |
| WO | WO2008008227 | 1/2008 | |
| WO | WO 2009058931 * | 5/2009 | ........... G01R 31/303 |

OTHER PUBLICATIONS

International Searching Authority, "Notification of Transmittal of the International Search Report and the Written Opinion of the International Searching Authority, or the Declaration," for PCT/US2011/038461, Jan. 11, 2012.

* cited by examiner

SOLUTION FOR FULL SPEED, PARALLEL DUT TESTING

CROSS REFERENCE TO RELATED APPLICATION

This application is a national stage application of International Application No. PCT/US2011/038461 filed May 28, 2011, which claims the benefit of U.S. Provisional Application No. 61/349,411, filed May 28, 2010, the disclosures of which are hereby incorporated by reference.

FIELD OF THE INVENTION

Embodiments relate to testing, and in particular to the testing of solid state storage devices

BACKGROUND

Solid state drives (SSDs) are data storage devices that use solid-state memory to store persistent data. An SSD emulates a hard disk drive interface, thus easily replacing it in most applications. An SSD connects to a personal computer (PC) via a standardized electrical communication protocol and a physical interface connector. Common examples of SSDs are battery backed dynamic random access memory (DRAM) volatile memory, NAND/NOR-based flash memory and other non-volatile storage class technologies. SSDs can have different form factors. SSDs are a relatively new product, and the industry is in the process of defining how to test them. Testing a variety of form factors and interface standards presents both mechanical and protocol/electrical challenges. In order to test an SSD, the tester needs to be able to connect via the physical connector, and support the interface protocol and electrical signaling.

Currently, the predominant testing architecture uses PC-based testers. A PC may connect to a storage device through a host bus adapter (HBA) and a cable. The HBA and its software drivers provide both the physical connector, the communication protocol, and electrical engine to convert operating system and storage protocol level commands from the computer into commands that the storage device can understand. The HBA may plug into the motherboard. The PC motherboard may include a central processing unit (CPU), memory, and the buses and controller chips to run the CPU, memory, and host adapters. An operating system and drives are required to run programs on the PC. The CPU and memory act as a shared pattern generator by running a program to send and receive data from the storage device. A problem with PC-based testers is that they have performance and parallelism limitations that are based on the performance of the components used. In addition, ways to enhance performance and enable parallelism can be costly.

SUMMARY OF THE INVENTION

In one embodiment, a system includes a configurable integrated circuit (IC) programmed to provide test patterns for use in automated test equipment, and an interface to at least one device under test (DUT). The system also includes a connection to the at least one DUT, wherein the connection is coupled directly between the configurable IC and the at least one DUT.

DETAILED DESCRIPTION

Figure 1:
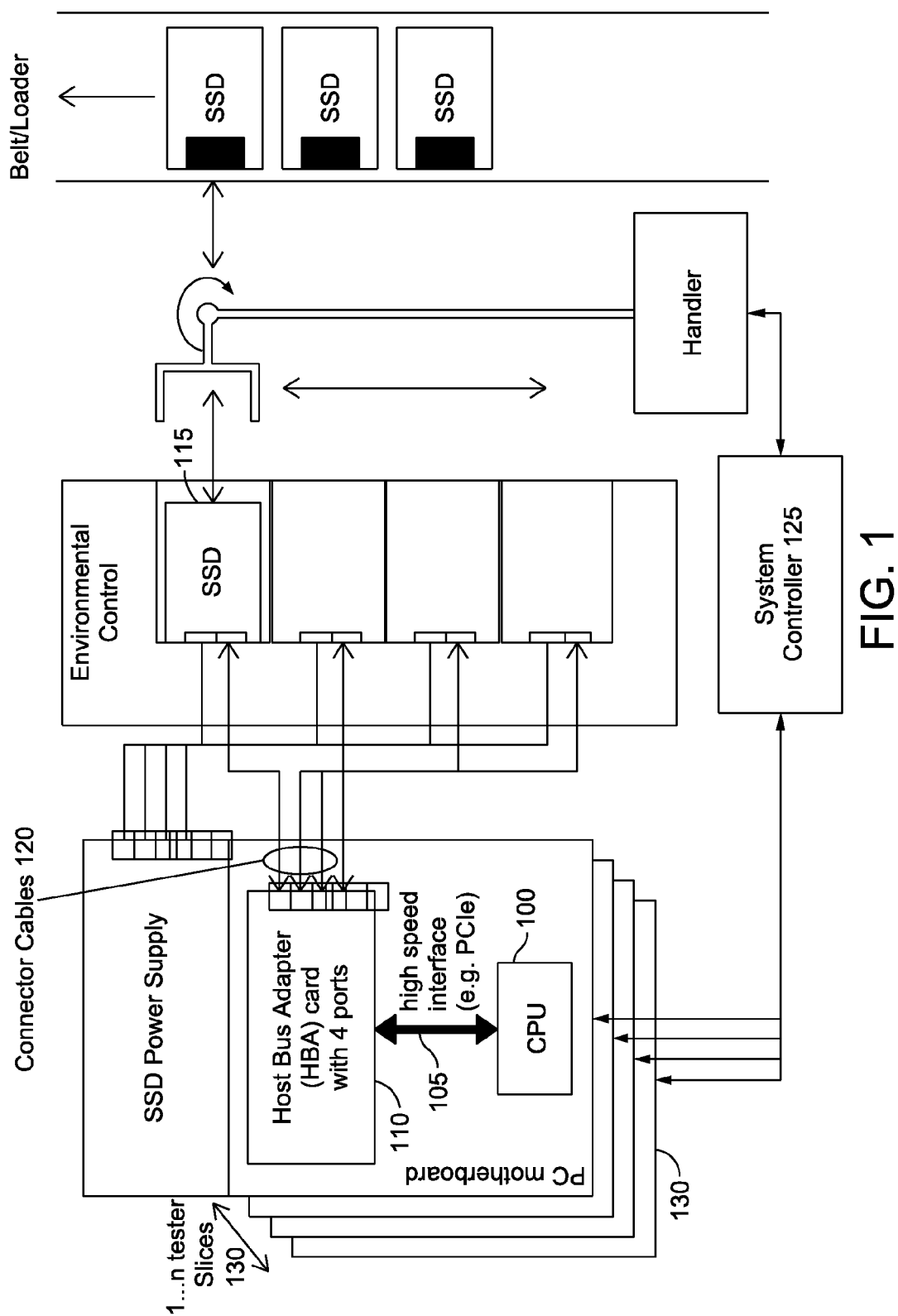
FIG. 1 illustrates a block diagram of an example PC-based tester system.

Embodiments described herein provide a system for use in automated test equipment. Embodiments also provide a corresponding method for testing a DUT, where the method may be employed using the disclosed system. In one embodiment, the system includes a configurable IC, such as an FPGA, programmed to provide test patterns, and an interface to at least one DUT. The configurable IC implements functionality of PC-based testers with improvements, yet avoids the inherent deficiencies of PC-based testers with respect to cost, performance, and scalability. Embodiments described herein provide full-speed parallel DUT testing, and are applicable to other applications where protocol-based interfaces are used to connect automated test equipment to a DUT. In one embodiment, the interface protocol may be either USB or peripheral component interconnect express (PCIe). In one embodiment, the connected DUTs may be PCI or USB based WiFi modules. Embodiments described herein optimize cost and parallelism while maintaining the full-speed and high-parallel testing capabilities.

In one embodiment, the configurable IC provides one or more per DUT dedicated pattern generation resources that may include storage pattern acceleration logic. In one embodiment, the configurable IC includes logic that provides the functionality of an HBA for the electrical and protocol connection to the DUT. As such, the configurable IC may provide a direct connection to the at least one DUT. In one embodiment, the configurable IC provides a logic layout and bus optimization so that pattern generation resources are located adjacent to the HBA logic, thus minimizing the number of buses used to connect the pattern generator and the HBA, and also allowing dedicated per DUT links between HBA and pattern generators. In one embodiment, a physical connection between the configurable IC and the DUT includes both the signals and a power source for the DUT and a per DUT controllable power supply with current measurement capability.

In one embodiment, a full-speed storage testing system may be defined as a solution that is capable of generating and receiving patterns used for storage testing at or close to the practical maximum throughput of a given interface standard (e.g., SATA 6 Gbps=maximum 600 MB/s). In one embodiment, if the utilized DUT is capable of processing and responding to the tester stimulus, then the measured throughput is equivalent to the maximum practical throughput of the interface. In one embodiment, if the DUT is not capable, then it is limited to the maximum throughput capability of the DUT. Full speed parallel testing may be defined as the ability to do full-speed testing independent of the number of DUTs connected to a single programmable chip. Each tester-per-DUT port is capable of testing the connected DUT at full speed. For example, the current instantiations of this architecture provide 2 to 8 tester-per-OUT ports powered by a single programmable chip, and the number of ports is expected to increase with future programmable chip generations.

FIG. 1 illustrates a block diagram of an example PC-based test system. In general, CPU 100 is connected by a high speed interface (e.g., PCIe) 105 to the HBA card 110, which may generally include 1 to 4 ports. The HBA card 110 is connected to one or more SSDs 115 by a connector cable 120 that plugs into the available HBA ports. Computer-based system controller 125 is connected to one or more PC-based testers 130, and is used to control the individual PC testers. There may be a plurality of tester slices 130, each comprising a CPU and associated HBA card. Note that the terms CPU and processor are used interchangeably.

For production test and benchmarking of SSDs, the performance of the CPU and memory, when used as a shared-pattern generator, needs to match that of the total number of connected devices being tested and the transfer performance of the utilized connection interface. Otherwise the DUTs will be waiting for the pattern generator. This may be rectified by purchasing additional or higher performance CPUs, as well as additional and/or higher performing DRAM, to improve performance. These physical components increase the overall footprint and the cost of a PC-based tester.

A PC may have multiple buses (e.g., PCIe), quick path interconnect (QPI), desktop management interface (DMI)) and software abstraction layers such as the OS and drivers, which are required to connect the DUTs to the pattern generator. These buses and software layers are generally optimized for personal computing rather than for high speed parallel storage testing. This has a negative impact on the time needed to transmit data between the DUT and the pattern generation resources and vice versa.

Figure 2:
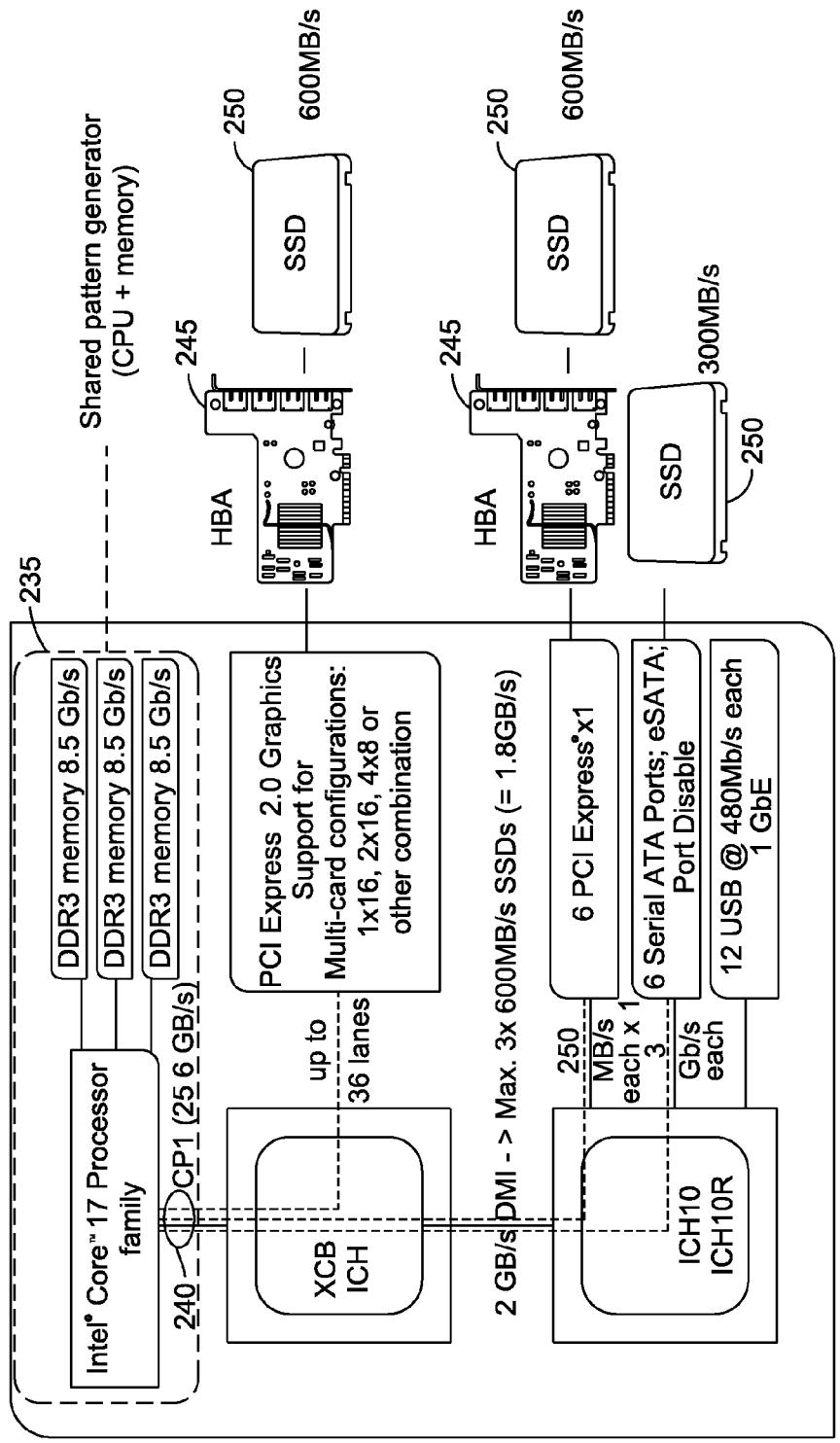
FIG. 2 illustrates a block diagram of an example shared-resource architecture of a PC-based tester system.

FIG. 2 illustrates a block diagram of an example shared-resource architecture of a PC-based test system. Patterns are generated by shared CPU and memory 235, and sent over QPI and DMI buses 240 to one or more HBAs 245 connected via PCIe slots. SSDs 250 are connected to one or more ports of the HBAs. High speed SSDs with 600 MB/s bandwidth stress the shared buses 240 and the pattern generator, resulting in bottlenecks. These bottlenecks include: a) the processing power of the shared CPU/DRAM for pattern generation; b) efficiency loss due to communication through the multiple buses; and c) operating system overhead. The combined bottleneck may cause up to 33% longer test times.

PCs when used as testers are generally a shared-resource architecture in that they often use one or more CPUs, access shared memory, access shared buses to talk to peripherals, such as HBAs that communicate with to drives. If a given PC accesses one drive, the PC may be deemed to have non-shared-resource architecture (e.g., one tester per DUT). When a PC tests or accesses more than one drive, the PC is deemed to have shared-resource architecture. The PC is not meant to be a high-parallelism storage tester, as a PC typically functions as a general purpose computer. Tester per DUT can be achieved by creating a specialized architecture, as described herein, or by using one PC per storage device.

Cost, performance, and size are a primary motivation. Accordingly, a powerful PC is used to achieve the best performance. Such a PC is shared across multiple drives to reduce cost and size/footprint. Typically, the trade off is performance versus reduced cost. A smaller size/footprint results in custom boards with higher cost. The performance loss may be compensated to a certain degree by employing more and faster processors (resulting in higher cost), but some components will always be shared due to the PC architecture (e.g., shared memory, shared peripheral buses such as PCIe, DMI, etc., and share HBAs).

The main reasons for using a PC for testing storage devices are: 1) it is a well known general purpose computer architecture; 2) it is typically cheaper (e.g., less development cost and leverage with high volume PC components); and 3) the tested storage devices end up being used in PCs. As such, there is the added benefit of being able to create a tester environment that is very close to the end use scenario.

As the volume of shipped SSD product increases, there is a need to test these storage products more efficiently. This will require equipment that can handle multiple interfaces and form factors in a single tester so as to: a) improve efficiency of testing a mix of products; b) provide higher density/higher parallelism test stations per square foot; and c) increased tester speeds/performance to enable optimal test times and avoid the test time overhead disadvantages of shared-resource architectures.

Embodiments described herein employ a programmable IC (e.g., an FPGA) with custom firmware and software images that implement the functionality of one or more PC-based testers in a single chip. In one embodiment, in addition to a CPU, the required electrical and protocol-based signaling is provided by on-chip programmable logic circuitry, which may include a pattern generator, a receiver, a pattern accelerator, an interface protocol (IP) core and dedicated pattern generator to IP core buses.

In one embodiment, an on chip implemented functional accelerator block, which may include a dedicated pattern generator and receiver, ensures dedicated per DUT resources which are optimized to match the speed of the target interface. Such a functional accelerator block allows deterministic stimulus of the DUT independent of the other implemented on chip testers.

In one embodiment, the functional accelerator block may function to offload work from the main processor. In one embodiment, the offloading may be achieved by the accelerator generating and receiving patterns. In one embodiment, the offloading may also be achieved by the accelerator combining multiple steps in a multi-step test function into a single step. For example, in one embodiment, the accelerator may provide a compare function that writes a pattern, reads that written pattern back, and then compares the two patterns. In one embodiment, the acceleration is to write a compare function.

In one embodiment, the interface core provides the functionality of the HBA. This ensures compliance and compatibility according to a given interface standard. In one embodiment, the target interface signaling speed is enabled by the selection of an appropriate programmable chip speed grade. The interface core may be acquired from a third party vendor but may require some customization to be compatible with the embodiments described herein. In one embodiment, the interface core/HBA provides two functions: 1) wraps storage commands into a standard protocol for transmission over a physical channel; and 2) is the electrical signal generator and receiver.

In one embodiment, the pattern generators and matching IP interface cores are implemented on chip next to each other and are connected using dedicated bus links. The close proximity of system components allows optimization of the links to match the target interface speeds, avoids bottlenecks inherent in shared-bus architectures, and keeps bus translation overhead to an absolute minimum.

In one embodiment, the combination of dedicated on chip resources which may include storage pattern acceleration, close proximity of the system logic to each other and dedicated bus links ensures full speed testing for any target interface standard. Using a programmable IC allows full control to optimize between performance and cost. For example, in cases where the CPU of the programmable chip solution is fast enough to support more than one interface at full speed, costs can be reduced by removing the dedicated pattern generator resources. In one embodiment, a lower speed and lower cost programmable chip can be selected to reduce cost, if the target interfaces do not require 3 Gbps or higher speeds. In one embodiment, if the target interface uses less high speed channels to communicate with the DUT, the programmable chip can be reconfigured to generate additional tester-per-DUT instantiations, thus increasing parallelism and lowering cost per DUT.

In one embodiment, it is estimated that for the targeted storage interfaces, 4 to 8 instantiations of a DUT tester can be created on chip on a single programmable chip. Each instantiation supports the full speed and full speed parallel testing features of the embodiments described herein. In one embodiment, DUT testers may be implemented on a single programmable chip. With 4 to 8 DUT testers per programmable chip, the system as described herein can reach the same or lower cost than PC-based testers with the added advantage of deterministic full speed parallel testing, which is not guaranteed with similarly priced shared-resource PC testers.

In one embodiment, the use of programmable chips allows a large degree of flexibility to optimize for cost, performance, and parallelism, and enables a software-based upgrade path to yet-to-be-released protocol interfaces for storage testing applications like SSDs, HDDs, etc.

Figure 3:
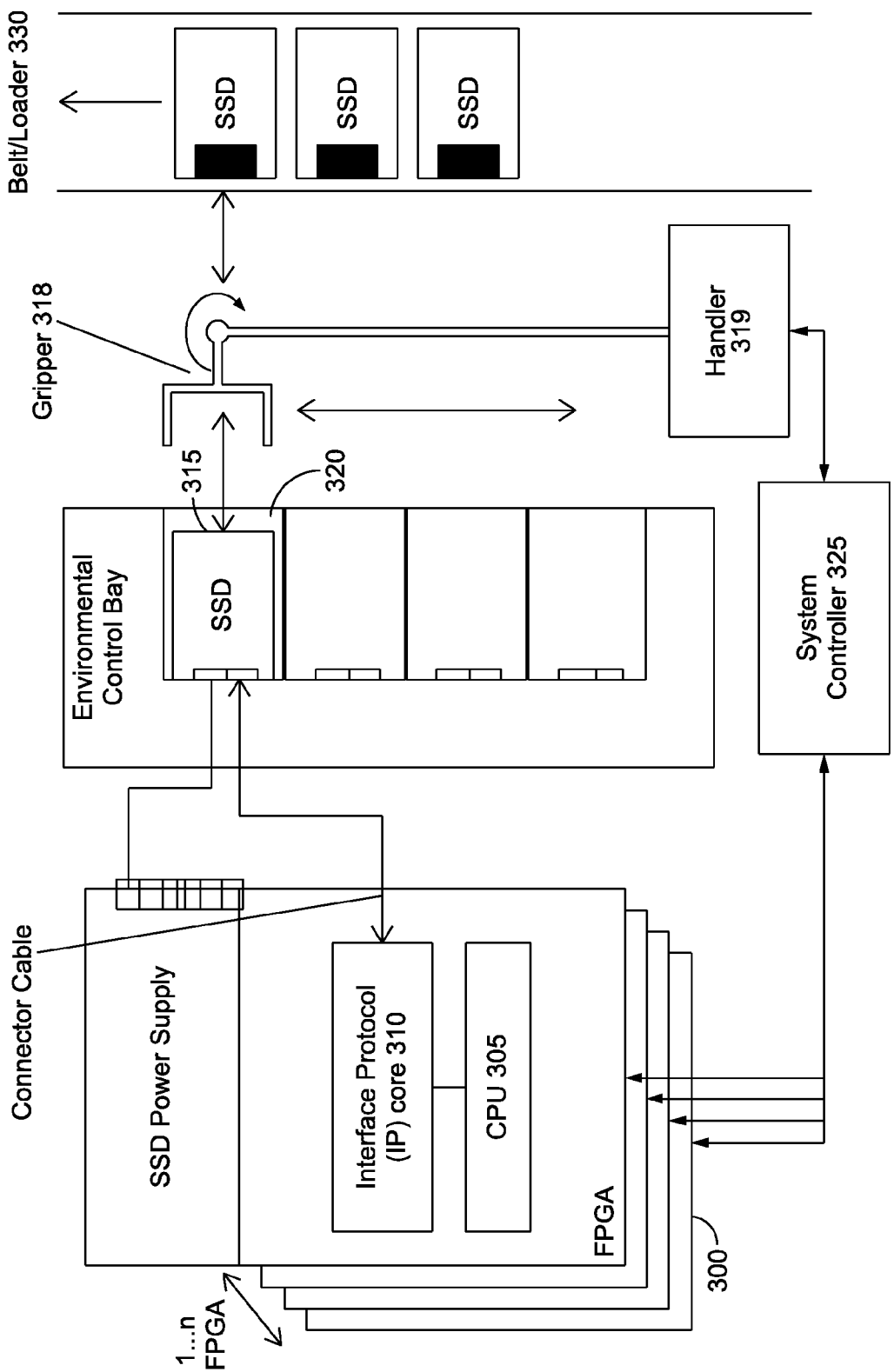
FIG. 3 illustrates a block diagram of an example field programmable gate array (FPGA)-based tester system, according to one embodiment.

FIG. 3 illustrates a block diagram of an example FPGA-based tester system according to one embodiment. One or more FPGAs 300 each include a CPU 305 in close proximity to an interface protocol (IP) core 310. IP core 310 is coupled directly to DUT 315, which is an SSD or other storage device. In some embodiments, other types of storage devices may include a hard disk drive (HDD), USB drive, flash cards, and a DRAM based disk. The connection may be a bus (parallel or serial) with one or more links to provide sufficient bandwidth. Each DUT has a dedicated power supply which may include current sense capability, and is controlled by the tester through a communication bus. In one embodiment, the handler may include a gripper 318, which moves the DUTs from the factory conveyor system to the tester and initiates the physical connection and release from the tester resources. The bay 320 that holds DUT 315 provides environmental control to stress the DUT during testing. In one embodiment, the environmental control may be implemented in three varieties: per DUT; shared chamber for multiple DUTs; and no thermal control for pure electrical functional testing. PC-based system controller 325, which centrally coordinates individual tester electronics, power supplies, handlers and environmental controls, is coupled to each FPGA, power supply, and handler. Handler 319 may transfer DUTs from belt/loader 330 to bay 320.

Figure 4:
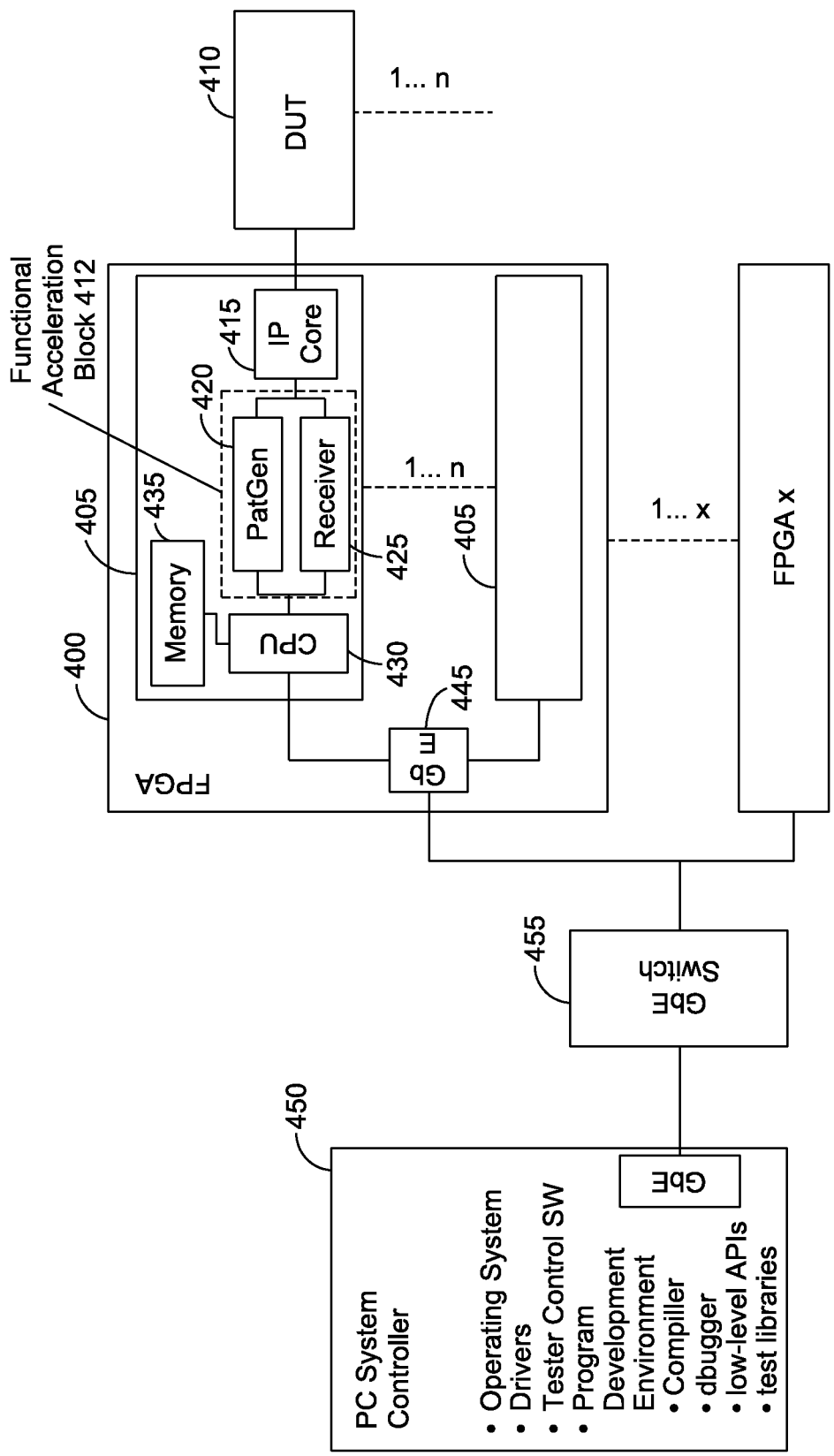
FIG. 4 illustrates a block diagram of a system utilizing an FPGA, according to one embodiment.

FIG. 4 illustrates a block diagram of an example system that utilizes an FPGA 400, according to one embodiment. FPGA 400 includes one or more dedicated testers 405, each of which connects to a single DUT 410. In one embodiment, DUT 410 may be a storage device. In one embodiment, DUT 410 may be an SSD. Each dedicated tester 405 comprises an interface protocol core (described interchangeably as IP core, Interface core or software HBA) 415, which connects directly to a DUT 410. As FIG. 4 shows, each dedicated tester 405 has its own on-chip CPU 430. Accordingly, this configuration has no shared resources.

In one embodiment, FPGA 400 also includes one or more functional acceleration blocks 412 and an interface core 415. The phrase interface protocol core may be used interchangeably with the phrase interface core, IP core or software HBA. In one embodiment, each function acceleration block includes a dedicated pattern generator 420 and a receiver 425. In one embodiment, a test stimulus (e.g., test pattern) is provided by logic provided by a pattern generator 420 and receiver 425, which is controlled by an on-chip CPU 430 with an associated memory 435.

In one embodiment, the functional acceleration block functions as a logical comparison unit. This allows comparison of written data and the same data read back for a given storage address. The hardware implementation allows very fast comparisons (microseconds vs. milliseconds) when compared to software based compare algorithms that require the execution of those software algorithms in a processor. With software based compare algorithms, write data needs to be stored in memory and sent over multiple busses to the DUT and then read back over multiple buses to be compared. This results in much overhead of transmitting the data over multiple buses, and requires a fast processor to execute the comparison code.

In one embodiment, the functional acceleration block functions as a coprocessor in that it is used as a processor which supplements the functions of the primary processor (e.g., the CPU). In one embodiment, operations performed by the functional acceleration block may be floating point arithmetic, graphics, signal processing, string processing, or encryption. By offloading processor intensive tasks from the main processor, the functional acceleration block accelerates the overall system performance. In one embodiment, the functional acceleration block may be used for both single DUT and parallel DUT testing.

In one embodiment, multiple testers 405 on a single FPGA 400 may be linked via an Ethernet connector 445. Multiple FPGAs 400 may be connected to system controller 450 via Ethernet (GbE) interface or switch 455. In one embodiment, system controller 450 may be implemented by a processor and may comprise an operating system (OS), drivers, tester control software, a program development environment including compiler, debugger, low-level APIs, and test libraries.

Figure 5:
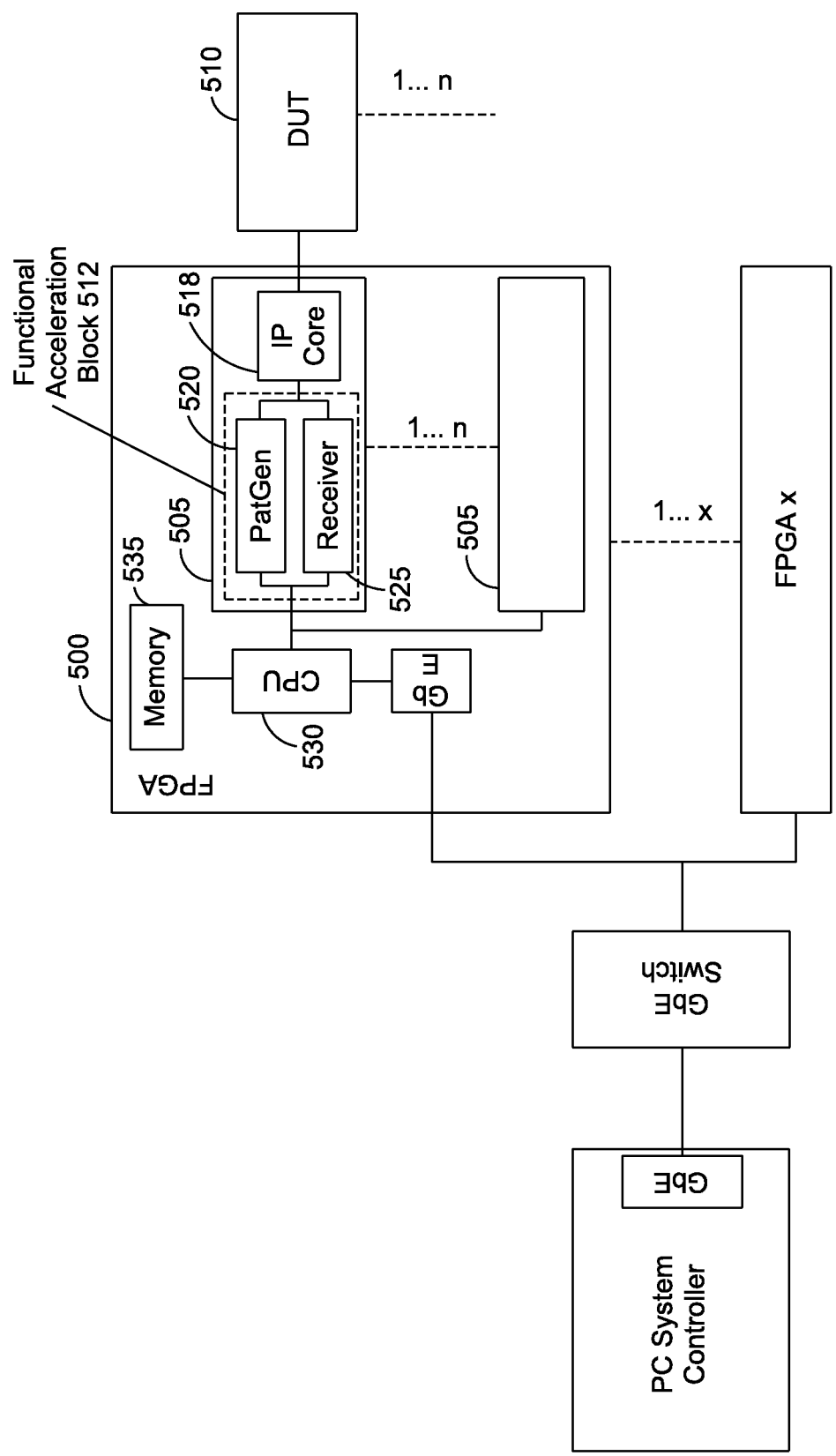
FIG. 5 illustrates a block diagram of a system utilizing an FPGA, according to another embodiment.
Figure 6:
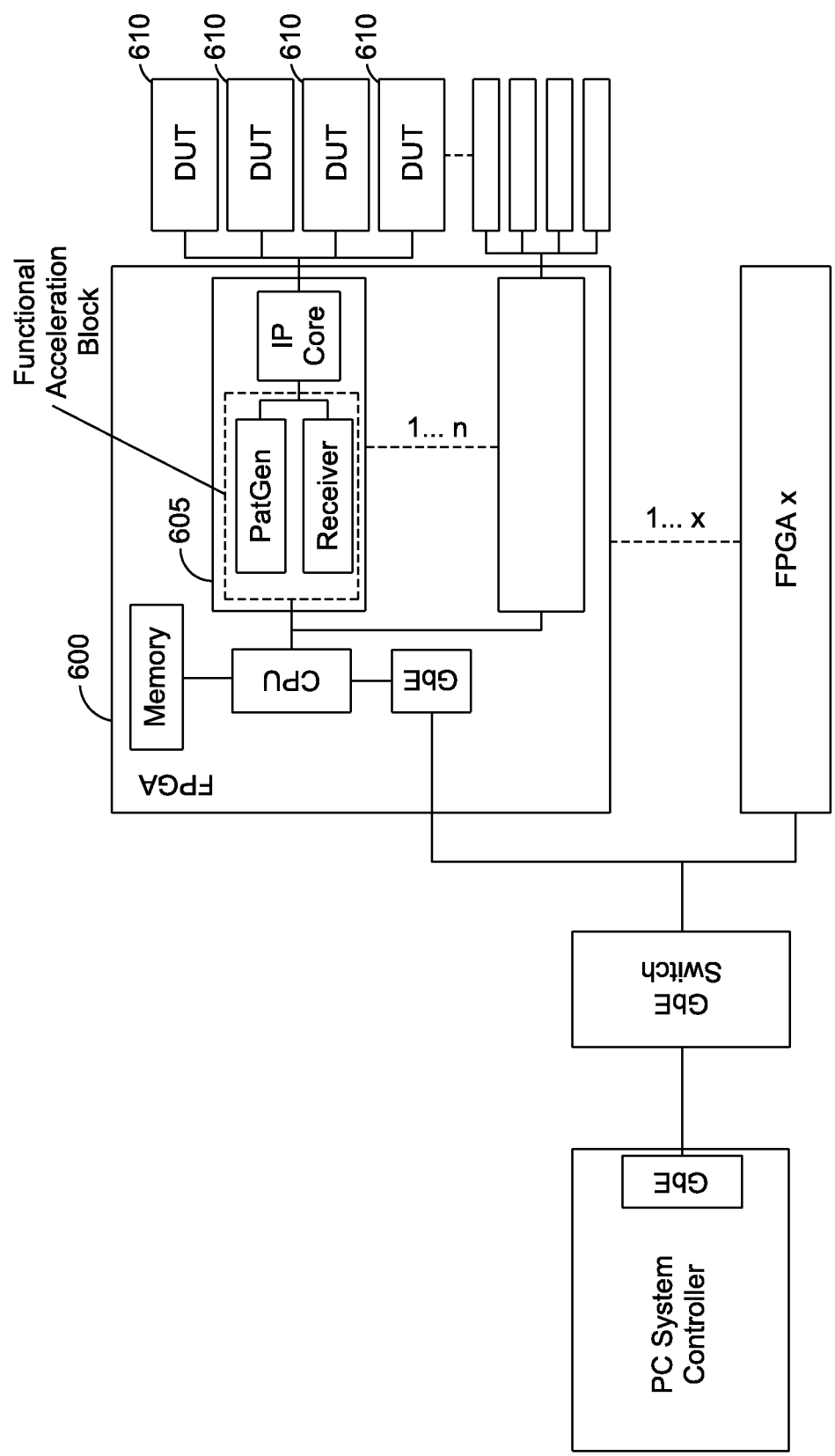
FIG. 6 illustrates a block diagram of a system utilizing an FPGA, according to another embodiment.
Figure 7:
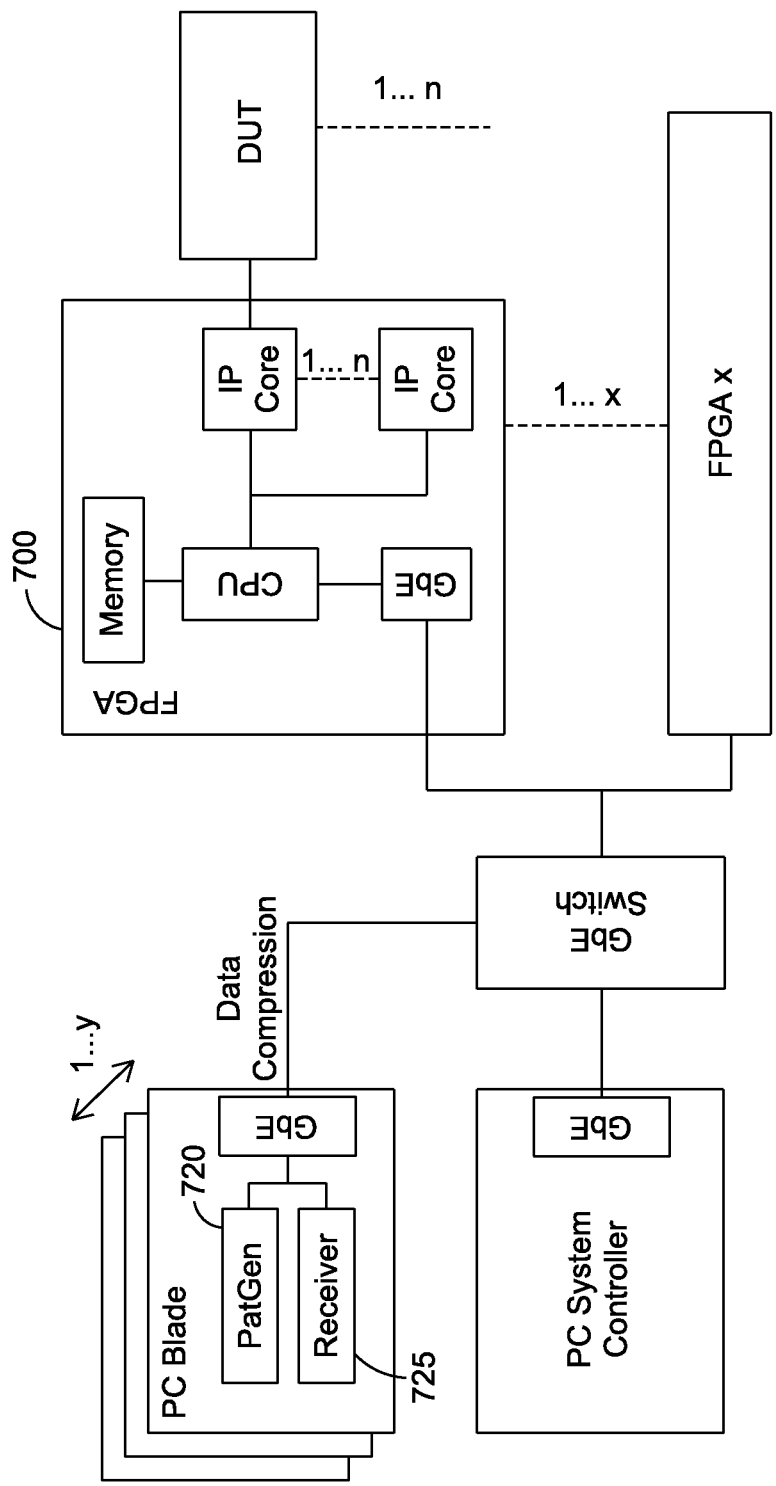
FIG. 7 illustrates a block diagram of a system utilizing an FPGA, according to another embodiment.

FIGS. 5, 6, and 7 show three other example FPGA configurations, according to other embodiments. Note that these embodiments are example configuration options, but not a complete or limiting set of configuration options.

FIG. 5 illustrates a block diagram of an example system that utilizes an FPGA 500, according to one embodiment. FPGA 500 includes one or more dedicated testers 505, each of which connects to a single DUT 510. In one embodiment, the dedicated portions of each tester 505 include a functional acceleration block 512 and an interface protocol core 518. In one embodiment, each functional acceleration block 512 includes a pattern generator 520 and a receiver 525.

In one embodiment, the CPU 530 and associated memory 535 are shared between multiple testers 505. This configuration, which is desirable from a cost standpoint, is practical when the CPU processing power is capable of generating and receiving stimulus to support the number of DUTs connected to it at full speed. This configuration differs from shared-resource PC architecture in that this configuration is implemented on chip with its layout and dedicated bus optimizations, thus enabling the use of a slower on-chip processor.

FIG. 6 illustrates a block diagram of an example system that utilizes an FPGA 600, according to another embodiment. The system of FIG. 6 is similar to that of FIG. 5, except that each dedicated tester 605 is connected to multiple DUTs 610. This may be referred to as a fan out configuration.

FIG. 7 illustrates a block diagram of an example system that utilizes an FPGA 700, according to another embodiment. In one embodiment, a pattern generator 720 and receiver 725 are located in a PC blade.

A key advantage of the embodiments described herein is their flexibility to optimize performance or cost by integrating the pattern generator and the interface logic on a single programmable chip, and having them in close proximity to minimize bottlenecks. In one embodiment, the system may be configured with a dedicated CPU per interface logic, or a single CPU can be shared across multiple interfaces if the CPU speed is sufficiently high compared to the required resources of the interfaces and the DUT.

Figure 8:
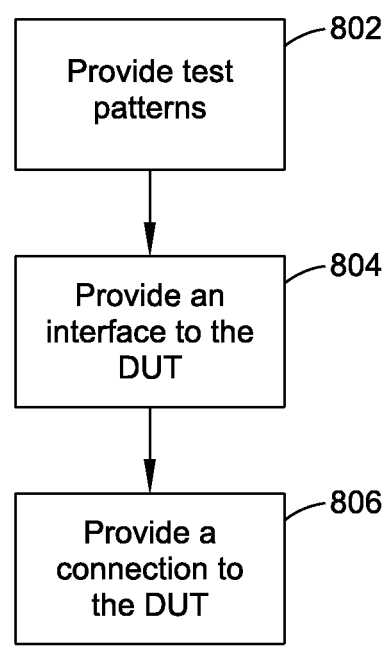
FIG. 8 is a flow diagram for an example method for testing a data storage device, according to one embodiment.

FIG. 8 is a flow diagram for an example method for testing a data storage device, according to one embodiment. In one embodiment, the data storage device is an SSD. The method is initiated in block 802, where the configurable IC provides test patterns. In one embodiment, the test patterns are used to test a DUT. An interface to the DUT is provided in block 804, and a connection to the DUT is provided in block 806.

In one embodiment, each of the processors (e.g., CPU 430 of FIG. 4) of the configurable IC generates test patterns. In one embodiment, each of the functional acceleration blocks (e.g., functional acceleration block 412 of FIG. 4) of the configurable IC generates test patterns. In one embodiment, where the one or more processors generate test patterns, one or more functional acceleration blocks may assist the one or more processors in generating the test patterns. For example, in one embodiment, a given functional acceleration block within the same configurable IC may assist the processor in the same configurable IC in generating test patterns.

In one embodiment, to provide test patterns, the configurable IC may execute a program running on a processor or a functional acceleration block between the processor and the interface. In one embodiment, the test patterns are protocol-based test patterns.

Figure 9:
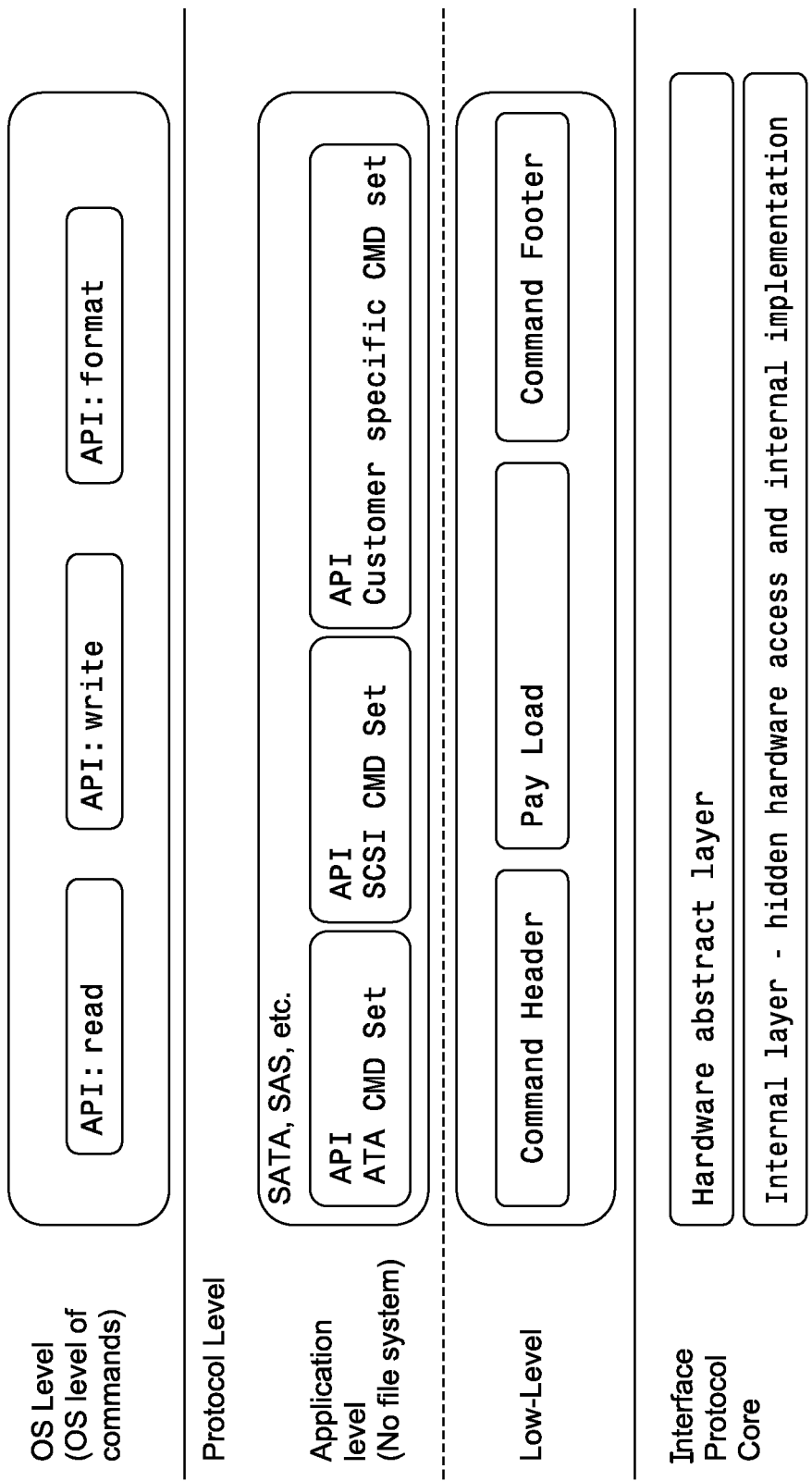
FIG. 9 illustrates a block diagram of example abstraction layers for storage protocol based test patterns, according to one embodiment.

FIG. 9 illustrates a block diagram showing example abstraction layers 900 for storage protocol based test patterns, according to one embodiment. In one embodiment, protocol based test patterns (PBTP) are test stimuli generated at the operating system (OS). In one embodiment, after PBTP are generated, they are converted by the OS into a standardized protocol command set, which are then converted into low-level packets. These low-level packets are understood by the interface core, which converts them to electrical signals. In one embodiment, PBTP may be generated using protocol command sets and low-level packets directly. An examples for an OS level command for storage applications is a read or write command. Examples for storage related protocol command sets are Advanced Technology Attachment (ATA) and Small Computer System Interface (SCSI) which are used for serial advanced technology attachment (SATA) and serial attached SCSI (SAS) interface cores. In one embodiment, low-level packets may manipulate command headers, pay load, command footers, etc.

The hardware implemented functional acceleration block may be used to accelerate a wide variety of software test functions. Such software test functions may include, for example: executing pre-defined patterns from a programmable buffer, algorithmic patterns like counters, checker board patterns, randomly generated data, comparison units that compare written data with read back data in a single execution step, protocol analyzer and injector by allowing access to the protocol level communication, etc. In block 804, the configurable IC provides an interface to the DUT. In a block 806, a connection is provided to the at least one DUT, where the connection is coupled directly between the configurable IC and the at least one DUT. The embodiments described herein or portions thereof may be computer-implemented. The computer system may include a processor (e.g., a processor core, a microprocessor, a computing device, etc.), a main memory and a static memory, which communicate with each other via a bus. The machine may further include a display unit that may comprise a touch-screen, or a liquid crystal display (LCD), or a light emitting diode (LED) display, or a cathode ray tube (CRT). As shown, the computer system also may include a human input/output (I/O) device (e.g. a keyboard, an alphanumeric keypad, etc), a pointing device (e.g., a mouse, a touch screen, etc.), a drive unit (e.g., a disk drive unit, a CD/DVD drive, a tangible computer readable removable media drive, an SSD storage device, etc.), a signal generation device (e.g., a speaker, an audio output, etc), and a network interface device (e.g., an Ethernet interface, a wired network interface, a wireless network interface, a propagated signal interface, etc.).

The drive unit may include a machine-readable medium on which is stored a set of instructions (e.g., software, firmware, middleware, etc.) embodying any one, or all, of the methodologies described above. The set of instructions is also shown to reside, completely or at least partially, within the main memory and/or within the processor. The set of instructions may further be transmitted or received via the network interface device over the network bus.

It is to be understood that embodiments of this invention may be used as, or to support, a set of instructions executed upon some form of processing core (such as the CPU of a computer) or otherwise implemented or realized upon or within a machine- or computer-readable medium. A machine-readable medium includes any mechanism for storing or transmitting information in a form readable by a machine (e.g. a computer). For example, a machine-readable medium includes read-only memory (ROM); random access memory (RAM); magnetic disk storage media; optical storage media; flash memory devices; electrical, optical, acoustical or other form of propagated signals (e.g. carrier waves, infrared signals, digital signals, etc.); or any other type of media suitable for storing or transmitting information.

It is not expected that the invention be limited to the exact embodiments disclosed herein. Those skilled in the art will recognize that changes and modifications can be made without departing from the inventive concept. By way of example, configurable integrated circuits other than FPGAs may be used. The scope of the invention may be construed in view of the claims.

The invention claimed is:

1. A system for use in automated test equipment, the system comprising:
    a configurable integrated circuit (IC) including a plurality of testers, wherein each tester connects to a single data storage device under test to perform fully speed deterministic testing and includes
a functional acceleration block including,
pattern generation logic to generate write data based upon test patterns;
receiver logic to receive read data; and
hardware implemented comparison logic to compare the write data and corresponding read data; and
an interface protocol core, wherein each interface protocol core is directly connected to the pattern generation logic of a respective functional acceleration block using dedicated bus links, wherein one or more data storage devices under test are removably directly connected to respective ones of the plurality of interface cores, and wherein the interface cores wraps storage command into a standard protocol for transmission over a physical channel as electrical signals to send the write data to storage locations in the storage device under test and receive the corresponding read data from the storage locations in the storage device under test.

2. The system of claim 1 wherein the configurable IC is a field programmable gate array (FPGA).

3. The system of claim 1 wherein the configurable IC further includes one or more processors, wherein the one or more processors control operation of the pattern generation logic and the receiver logic.

4. The system of claim 1 wherein the configurable IC is substantially fully dedicated to automated testing.

5. The system of claim 1 wherein the configurable IC is optimized for high-speed parallel testing.

6. The system of claim 1 wherein the configurable IC generates a test stimulus including the write data to the attached data storage device under test at close to the maximum speed of the interface utilized to connect the data storage devices under test to the corresponding interface cores.

7. The system of claim 1 wherein the configurable IC comprises a plurality of testers, wherein each tester includes one of the functional acceleration blocks and a respective one of the interface cores, and wherein each tester tests different sets of data storage device under test.

8. The system of claim 1 wherein the configurable IC tests a plurality of the data storage devices in parallel.

9. The system of claim 1 wherein the configurable IC further includes one or more processors, wherein the one or more processors generate the test patterns.

10. The system of claim 1 wherein the functional acceleration blocks generate the test patterns.

11. The system of claim 1 wherein the functional acceleration blocks implement application specific functions as programmable circuits in the configurable IC, and wherein the application specific functions are executed with minimal or no oversight from a processor.

12. The system of claim 1 wherein the functional acceleration blocks implement application specific functions that enable faster functionality than software based functions running on a processor.

13. The system of claim 1 wherein the functional acceleration blocks implement application specific functions that enable lower implementation costs than a software based function running on a processor.

14. The system of claim 1 wherein the data storage devices under test are solid state drives.

15. An apparatus comprising:
a configurable integrated circuit (IC) for testing data storage device, wherein the configurable IC includes a plurality of testers implemented by an array of programmable logic blocks and a hierarch of reconfigurable interconnects, each tester including,
a functional acceleration block including,
pattern generation logic to generate write data based upon test patterns;
receiver logic to receive read data; and
comparison logic to compare the write data and corresponding read data; and
an interface protocol core that directly connects a single storage devices under test to the test pattern generation logic of the respective functional acceleration block of the tester using dedicated bus links, wherein the interface cores send the write data to storage locations in the data storage device under test and receive the corresponding read data from the storage location in the data storage device under test, and
wherein each functional acceleration block and corresponding interface core are in close proximity to a respective data storage device under test to allow optimized connectivity with regards to minimal management overhead, matched bandwidth and latency to avoid bottlenecks and to allow communication with the data storage device under test at maximum speed.

16. The apparatus of claim 15 wherein the configurable IC is a field programmable gate array (FPGA).

17. The apparatus of claim 15 wherein the configurable IC is substantially fully dedicated to automated testing.

18. The apparatus of claim 15 wherein the configurable IC is optimized for highspeed parallel testing a plurality of the data storage device under test.

19. The apparatus of claim 15 wherein the configurable IC generates a test stimulus including the write data to the attached data storage device under test at close to the maximum speed of the interface utilized to connect the data storage devices under test to the corresponding interface cores.

* * * * *